United States Patent
Seo et al.

(10) Patent No.: US 8,242,811 B2
(45) Date of Patent: Aug. 14, 2012

(54) HIGH-BANDWIDTH ON-CHIP COMMUNICATION

(76) Inventors: Jae-sun Seo, White Plains, NY (US);
Ronald Ho, Mountain View, CA (US);
Robert J. Drost, Los Altos, CA (US);
Robert D. Hopkins, Hayward, CA (US)

( * ) Notice: Subject to any disclaimer, the term of this patent is extended or adjusted under 35 U.S.C. 154(b) by 0 days.

(21) Appl. No.: 12/758,189

(22) Filed: Apr. 12, 2010

(65) Prior Publication Data

US 2011/0248750 A1    Oct. 13, 2011

(51) Int. Cl.
*H03K 3/00* (2006.01)

(52) U.S. Cl. ............................ 327/109; 326/81; 327/108

(58) Field of Classification Search .............. 326/68–83, 326/86, 34; 327/111
See application file for complete search history.

(56) References Cited

U.S. PATENT DOCUMENTS

| | | | |
|---|---|---|---|
| 6,084,537 A * | 7/2000 | Hardy et al. .................... | 341/68 |
| 6,320,406 B1 * | 11/2001 | Morgan et al. .................. | 326/14 |
| 6,909,329 B2 * | 6/2005 | Jasa et al. ...................... | 331/1 A |
| 8,102,020 B2 * | 1/2012 | Ho et al. ....................... | 257/532 |
| 2007/0268047 A1 * | 11/2007 | Hopkins et al. ................ | 327/111 |

* cited by examiner

*Primary Examiner* — Shawki S Ismail
*Assistant Examiner* — Crystal L Hammond
(74) *Attorney, Agent, or Firm* — Park, Vaughan, Fleming & Dowler LLP

(57) ABSTRACT

Some embodiments of the present invention provide techniques and systems for high-bandwidth on-chip communication. During operation, the system receives an input voltage signal which is to be transmitted over a wire in a chip. The system then generates one or more modified voltage signals from the input voltage signal. Next, the system drives each of the voltage signals (i.e., the input voltage signal and the one or more modified voltage signals) through a respective capacitor. The system then combines the output signals from the capacitors to obtain a combined voltage signal. Next, the system transmits the combined voltage signal over the wire. The transmitted signals can then be received by a hysteresis receiver which is coupled to the wire through a coupling capacitor.

14 Claims, 11 Drawing Sheets

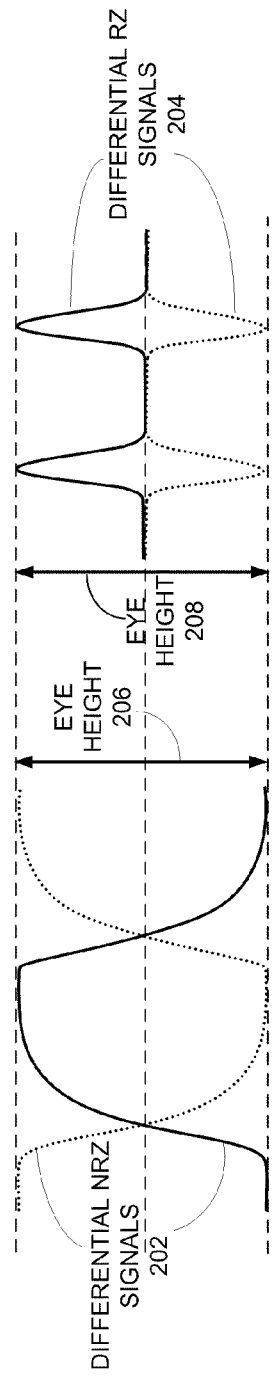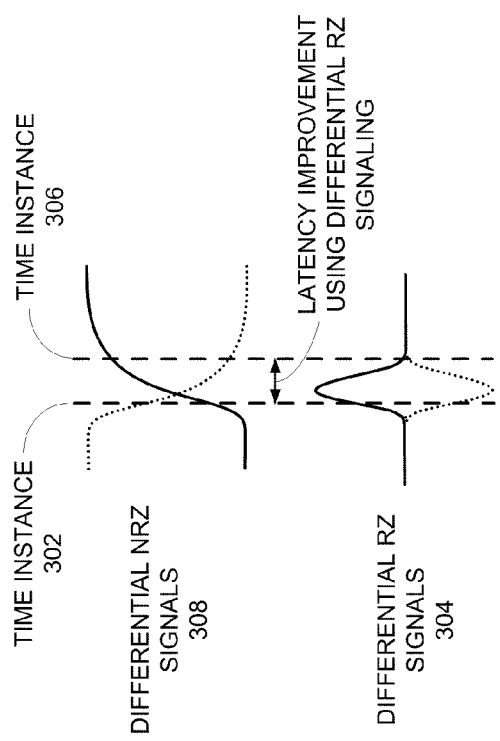

HIGH-BANDWIDTH ON-CHIP COMMUNICATION

BACKGROUND

1. Technical Field

This disclosure generally relates to design of integrated circuit (IC) chips. More specifically, this disclosure relates to methods and systems for high-bandwidth on-chip communication.

2. Related Art

On-chip global wires are becoming an increasingly serious concern in current microprocessor designs in terms of latency, bandwidth, and power consumption. A simple yet effective solution to improve the latency of on-chip wires is to use repeaters, but the number of repeaters that are required and the power consumption of the repeaters are increasing with each technology step.

A number of approaches have been proposed to improve communication performance and reduce power consumption of global on-chip wires. In one such approach, transmission lines are used to offer near speed-of-light latency and high bandwidth. However, this approach requires considerably more wire resources, which results in poor bandwidth density (Gb/s/µm). Another approach uses current sensing techniques to reduce latency and improve bandwidth, but such approaches suffer from high static power consumption, which can negate the latency and bandwidth improvements. Some approaches use a pre-emphasis technique to reduce inter-symbol-interference (ISI) and improve data rate. Unfortunately, the energy consumption in these approaches can be too high even when no data activity is present because the energy consumption does not scale with data activity.

Approaches that drive a wire capacitively can increase on-chip wire bandwidth by capacitive pre-emphasis and enable low-swing signaling without requiring a second supply. Unfortunately, the latencies in these approaches are worse than the latencies of optimally repeated wires in scaled technology nodes with narrow wires. Moreover, the bandwidth in these approaches is severely limited by the slow slew rates of receiver-end signals.

Hence, what is needed are methods and systems for improving bandwidth of on-chip wires without the above-described drawbacks.

SUMMARY

This disclosure describes methods and systems for high-bandwidth on-chip communication. A system can receive an input voltage signal which is to be transmitted over a wire within a chip. The input voltage signal can encode data bits by representing a data bit using a particular voltage value. For example, the input voltage signal may use a low voltage value to represent a "0" and a high voltage value to represent a "1." The system can then generate one or more modified voltage signals from the input voltage signal. A modified voltage signal can include a delayed and inverted version of the input voltage signal and/or a delayed and non-inverted version of the input voltage signal. Next, the system can drive each of the voltage signals (i.e., the input voltage signal and the one or more modified voltage signals) through a respective capacitor. The system can then combine the outputs from the capacitors to obtain a combined voltage signal. Note that the sizes of the capacitors relative to one another determine how the voltage signals are combined. Next, the system can transmit the combined voltage signal over one end of the wire. In some embodiments, the transmitted voltage signal can then be received through a capacitor at the other end of the wire. In some embodiments, the transmitted voltage signal is received using a hysteresis receiver.

In some embodiments, the combined voltage signal is shaped so that the signal received at the receiver has a desired return-to-zero (RZ) pulse shape. Note that the term "RZ pulse" as used in this disclosure does not signify a particular line code. An RZ pulse is a rapid, transient change in the voltage of a signal from a baseline value to a higher or lower value, followed by a rapid return to the baseline value. In some embodiments, the system generates RZ pulses only for transitions in the input data stream, i.e., RZ pulses are generated only when the input data stream bit changes from a zero to a one or from a one to a zero. In these embodiments, RZ pulses are not generated when the input data stream is a series of zeroes or a series of ones.

One embodiment of the present invention is a circuit which transmits signals over a wire within a chip. The circuit includes a first voltage signal path which is capacitively coupled to a first end of the wire through a first capacitor, wherein the first signal path is configured to pass an input voltage signal through the first capacitor. The circuit also includes one or more additional voltage signal paths, wherein each of the one or more additional voltage signal paths is capacitively coupled to the first end of the wire through a respective capacitor, and wherein each of the one or more additional voltage signal paths is configured to modify the input voltage signal and pass the respective modified input voltage signal through the respective capacitor.

Another embodiment of the present invention is a chip which includes: a first chip module, a second chip module, and a wire disposed between the first chip module and the second chip module. The first chip module includes a first voltage signal path which is capacitively coupled to a first end of the wire through a first capacitor, wherein the first voltage signal path is configured to pass an input voltage signal through the first capacitor. The first chip module also includes one or more additional voltage signal paths, wherein each of the one or more additional voltage signal paths is capacitively coupled to the first end of the wire through a respective capacitor, and wherein each of the one or more additional voltage signal paths is configured to modify the input voltage signal and pass the respective modified input voltage signal through the respective capacitor. The second chip module includes a receiver which can be capacitively or directly coupled to a second end of the wire through a second capacitor. The receiver receives the transmitted voltage signal through the second capacitor. In some embodiments, the receiver includes hysteresis receiver circuitry.

BRIEF DESCRIPTION OF THE FIGURES

FIG. 2 illustrates an eye height comparison of a differential NRZ signaling scheme and a differential RZ signaling scheme in accordance with some embodiments of the present invention.

FIG. 3 illustrates a latency comparison between differential NRZ signals and differential RZ signals in accordance with some embodiments of the present invention.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Non-Return-to-Zero (NRZ) Signals and Return-to-Zero (RZ) Signals

Figure 1A:
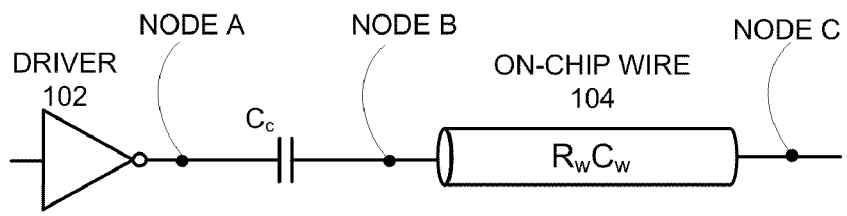
FIG. 1A illustrates a circuit which includes a driver which drives an on-chip wire through a coupling capacitor.

FIG. 1A illustrates a circuit which includes a driver 102 which drives an on-chip wire 104 through a coupling capacitor. Note that the term "wire" as used in this disclosure can include any type of on-chip interconnect for passing a signal from one end of the interconnect to the other end of the interconnect.

As shown in FIG. 1A, $C_w$ represents the capacitance of on-chip wire 104 ("wire 104" hereinafter) and $R_w$ represents the resistance of wire 104. A coupling capacitor $C_c$ is inserted between driver 102 and wire 104 and acts to divide the voltage applied to its left node A, so that the voltage seen at its right node B has a reduced voltage swing. During operation, driver 102 drives an input signal from node A across coupling capacitor G and wire 104 to node C. In the discussion that follows, we refer node B as "the transmitter side" of wire 104, and node C as "the receiver side" of wire 104.

One advantage of using coupling capacitor $C_c$ is that it can reduce the effective load $C_{eff}$ that is seen by the driver 102. This allows the wire to be driven by a smaller driver. Another advantage of using coupling capacitor $C_c$ is that it improves the bandwidth by pre-emphasizing the signal which counteracts the low-pass filter behavior of the on-chip wire.

Figure 1B:
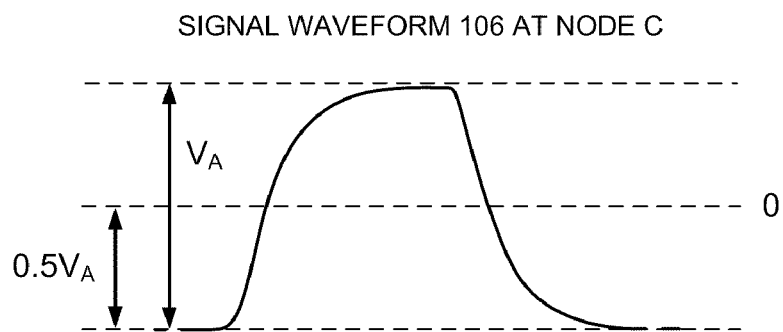
FIG. 1B illustrates a signal waveform which corresponds to a positive transition in a non-return-to-zero (NRZ) signal being transmitted across an on-chip wire.

FIG. 1B illustrates a signal waveform 106 at node C which corresponds to a positive transition in an NRZ signal being transmitted across wire 104. In FIG. 1B, $V_A$ denotes the full swing of signal waveform 106. Note that signal waveform 106 makes a fast transition to about $0.5\,V_A$, but then slowly saturates to the full swing $V_A$.

Figure 1C:
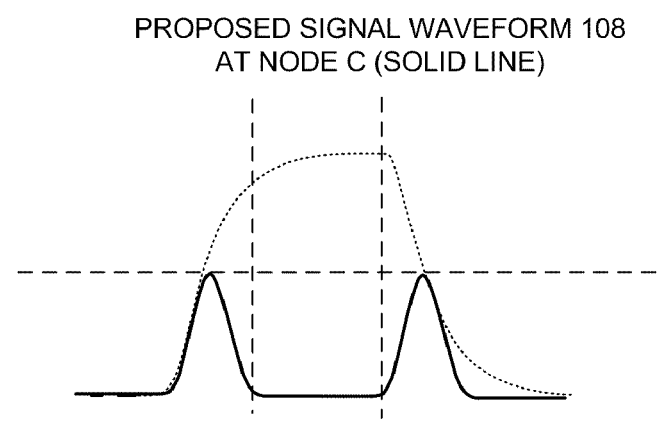
FIG. 1C illustrates a proposed signal waveform to improve bandwidth in accordance with some embodiments of the present invention.

FIG. 1C illustrates a proposed signal waveform 108 at node C which can achieve bandwidth improvement over signal waveform 106 in FIG. 1B in accordance with some embodiments of the present invention. In FIG. 1C, an RZ signal waveform 108 (the solid line) first follows signal waveform 106 (the dotted line) in the fast first half of the transition, but then sharply drops back to zero. As a result, a fast RZ signal 108 is created which can have up to a 2.5× bandwidth improvement over NRZ signal 106. Note that while RZ signal 108 reaches only half of the signal swing of that in NRZ signal 106, this loss in voltage swing can be compensated for by sending the RZ signal differentially.

FIG. 2 illustrates an eye height comparison of the differential NRZ signaling scheme and the proposed differential RZ signaling scheme in accordance with some embodiments of the present invention. As illustrated in FIG. 2, in differential NRZ signaling, a maximum eye height 206 of differential NRZ signals 202 equals the full swing of each of differential NRZ signals 202. In contrast, in differential RZ signaling, each of the two differential RZ signals 204 move in the opposite direction from zero, resulting in a maximum eye height 208 which is identical to eye height 206 in the differential NRZ signaling. Maintaining the eye height while using differential RZ signaling is important because it avoids the need for pushing toward minimum detectable swing at the receiver, which would otherwise require more offset compensation circuitry and complicate receiver designs, leading to more energy consumption. Note that the two differential RZ signals 204 have a common value when there is no data activity.

Using fast RZ signaling can also improve the latency of signal communication over on-chip wires. FIG. 3 illustrates a latency comparison between differential NRZ signals and differential RZ signals at the receiver side of the on-chip wire in accordance with some embodiments of the present invention. At time instance 302 differential RZ signals 304 reach minimum separation between the two differential signals for correctly evaluating the received data value. On the other hand, at time instance 306 differential NRZ signals 308 reach minimum separation between the two differential signals for correctly evaluating the received data value. The difference between time instance 302 and time instance 306 represents the amount of improvement in latency of the differential RZ signaling scheme over the differential NRZ signaling scheme.

Note that, when differential NRZ signals 308 reach half of the swing (i.e., at the cross-over point of the two signals), the two differential signals are at the same voltage level and therefore cannot be used to evaluate the data value. However, at this point, differential RZ signals 304 have already separated by the maximum amount, and passed the minimum separation for evaluating data values.

Note that when using RZ signaling for data communication over narrow on-chip wires, an RZ pulse can smear out as it propagates through the wire because the wire acts as a distributed low-pass filter. The smeared-out RZ pulses lead to inter-symbol-interference (ISI) between consecutive data bits being transmitted, thereby limiting the data rate and bandwidth. To further improve the achievable bandwidth using differential RZ signaling, some embodiments of the present invention propose transmitting a sequence of bipolar signals over the on-chip wire to reduce or eliminate ISI and to produce fast and clean RZ signals at the receiver side of the wire.

Signal Analysis

Simulation (e.g., using a Matlab®) can be performed to understand how to build a proper sequence of bipolar signals to reduce or eliminate ISI. Specifically, a simulation can be performed to determine the shape of a pulse at the receiver end of a wire when a pulse with a particular shape is transmitted from the transmitter end of the wire. Conversely, a simulation can be performed to determine the shape of the pulse that should be transmitted at the transmitter end of the wire so that it produces a pulse with a desired shape at the receiver end of the wire.

Figure 4:
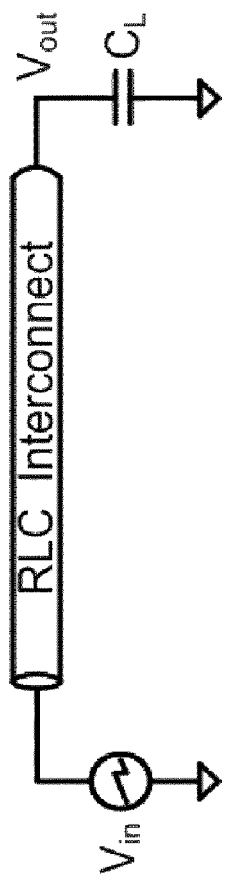
FIG. 4 illustrates an on-chip wire model in accordance with some embodiments of the present invention.

FIG. 4 illustrates an on-chip wire model 400 in accordance with some embodiments of the present invention. As illustrated in FIG. 4, a on-chip wire can be modeled as a distributed RLC interconnect and mathematically represented by a 2nd-order approximation of the transfer function H(s) between voltages $V_{in}$ and $V_{out}$. In FIG. 4, R, L, and C are the lumped resistance, inductance, and capacitance values, respectively, that are used for modeling the on-chip wire.

Figure 5:
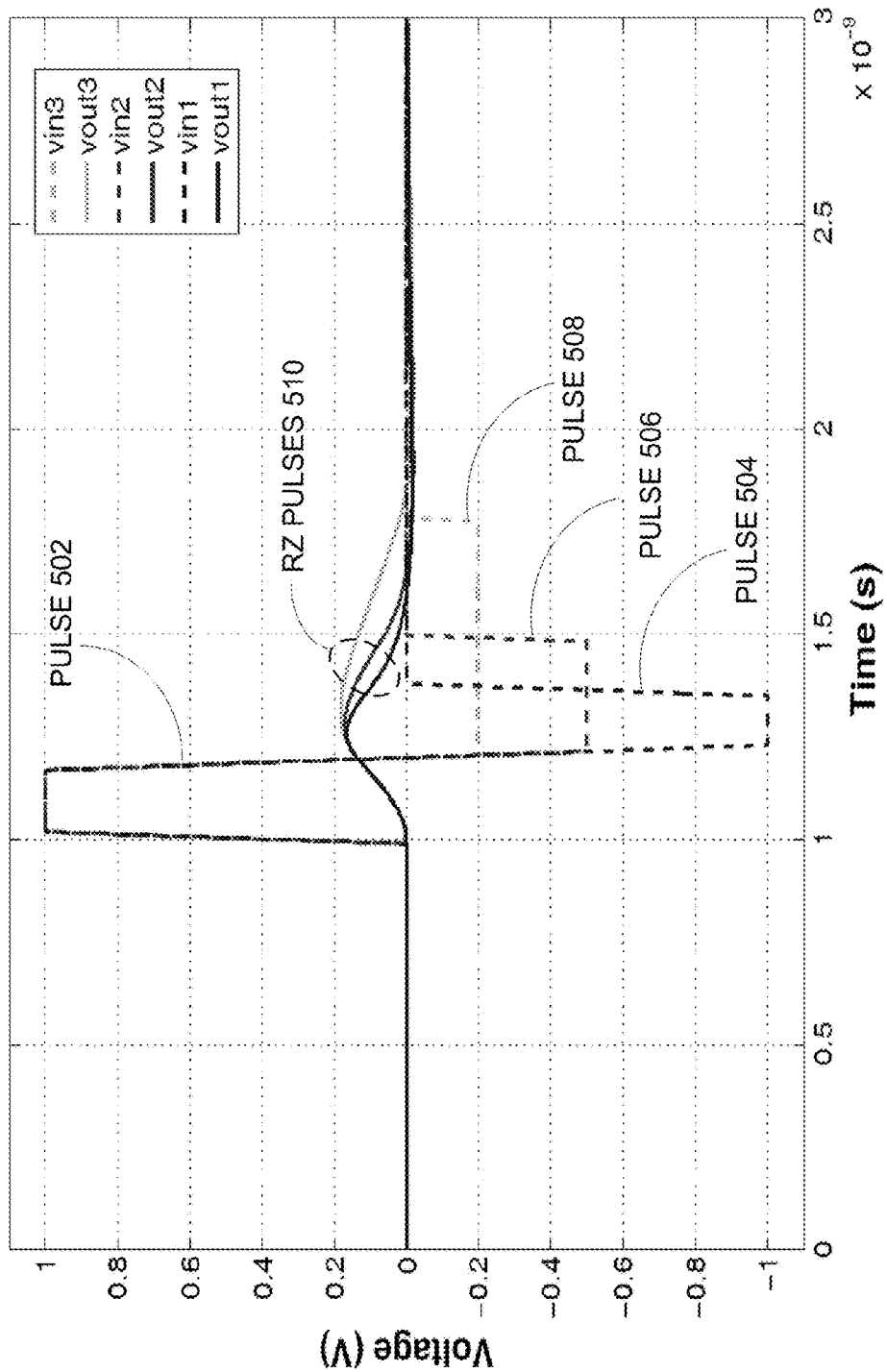
FIG. 5 illustrates simulation results for an RLC interconnect in accordance with some embodiments of the present invention.

FIG. 5 illustrates simulation results for an RLC interconnect in accordance with some embodiments of the present invention. As illustrated in FIG. 5, after sending a fixed positive pulse 502, various negative pulses 504, 506, and 508 with different pulse widths and amplitudes are sent through the RLC interconnect. The areas under the negative pulses are kept as a constant and identical to the area under positive pulse 502 to ensure that $V_{out}$ returns to zero. For a given input signal, the output waveform can be generated using the following equation:

$$V_{out}(t)=IFFT[FFT(V_{in}(t))\times H(s)], \qquad (1)$$

where $V_{in}(t)$ is the input signal in the time domain, FFT is the fast Fourier transform operation, H(s) is the transfer function of the RLC interconnect in the frequency domain, IFFT is the inverse FFT operation, and $V_{out}(t)$ is the output signal in the time domain.

The resulting output waveforms corresponding to various input signals are illustrated in FIG. 5 as a series of broadening RZ pulses 510, wherein an RZ pulse with a sharper profile corresponds to a negative input pulse with a smaller pulse width and larger amplitude. Specifically, in this simulation, negative pulse 504 provides the best result in eliminating the ISI in the wire. This suggests that a symmetric negative pulse which has the same amplitude and pulse width as the positive pulse results in a sharper RZ pulse at the receiver end of the wire.

Figure 6:
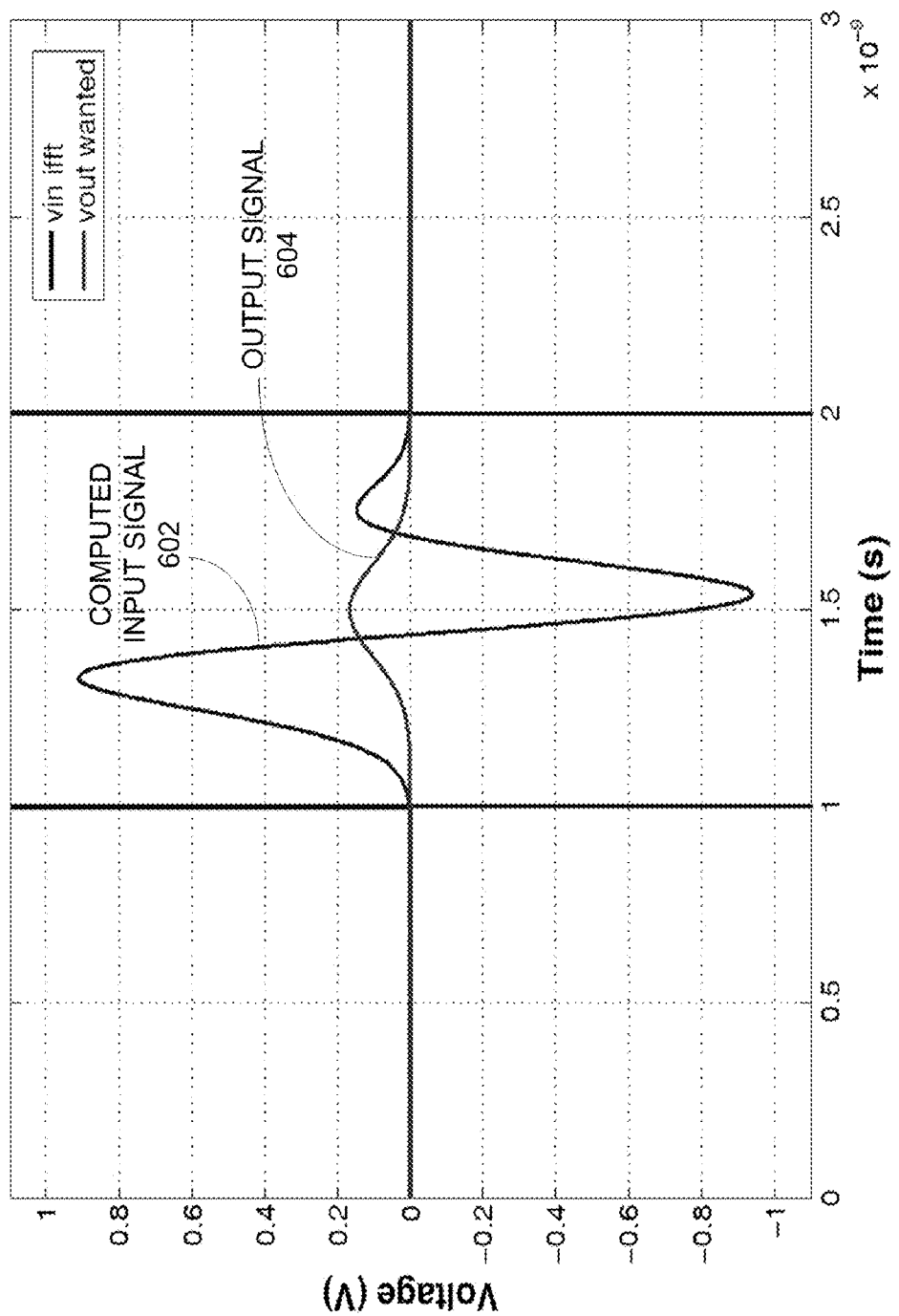
FIG. 6 illustrates simulation results for an RLC interconnect in accordance with some embodiments of the present invention.

FIG. 6 illustrates simulation results for an RLC interconnect in accordance with some embodiments of the present invention.

The simulation results shown in FIG. 6 illustrate the input signal $V_{in}(t)$ that results in a Gaussian RZ pulse $V_{out}(t)$. The input signal $V_{in}(t)$ can be computed using the following equation:

$$V_{in}(t)=IFFT[FFT(V_{out}(t))/H(s)]. \qquad (2)$$

The positive and negative pulses in computed input signal 602 have identical amplitudes. This is in agreement with the simulation results illustrated in FIG. 5. Additionally, the smaller positive rise in computed input signal 602 following the negative spike helps critically damp the falling part of output signal 604 back to zero.

Communication System

Figure 7A:
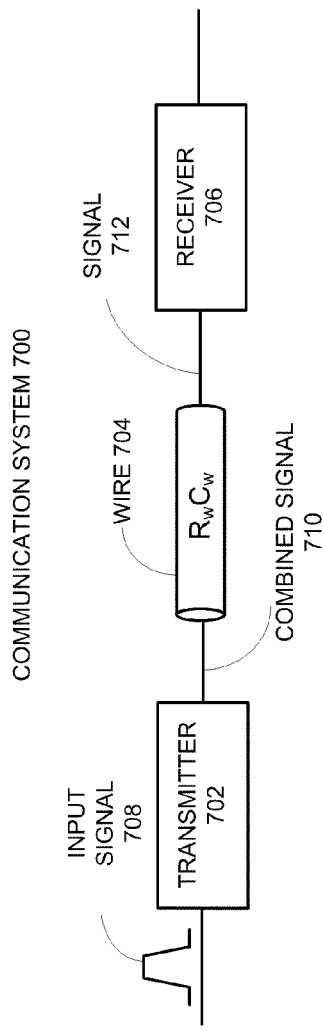
FIG. 7A illustrates a communication system for transmitting signals over a wire in accordance with some embodiments of the present invention.

FIG. 7A illustrates a communication system 700 for transmitting signals over a wire in accordance with some embodiments of the present invention. More specifically, communication system 700 comprises transmitter 702, wire 704, and receiver 706. Input signal 708 is to be transmitted from the transmitter side (i.e., the left side in FIG. 7A) of wire 704 to the receiver side (i.e., the right side in FIG. 7A) of wire 704 through wire 704. In one embodiment, wire 704 is an on-chip wire characterized by a distributed resistance $R_w$ and capacitance $C_w$.

As shown in FIG. 7A, transmitter 702 receives input signal 708 and produces a combined signal 710 which is a combination of the input signal 708 and one or more modified signals. In one embodiment of the present invention, transmitter 702 is implemented as an n-tap finite impulse response (FIR) filter (n>1) comprising n parallel signal paths. Specifically, combined signal 710 can include a sequence of bipolar signals produced by the n-tap FIR filter. Transmitter 702 subsequently transmits combined signal 710 onto wire 704. Receiver 706 receives signal 712 at the receiver side of wire 704. Signal 712 has a waveform that enables receiver 706 to correctly recover the data that was encoded in input signal 708.

Transmitter Design

Figure 7B:
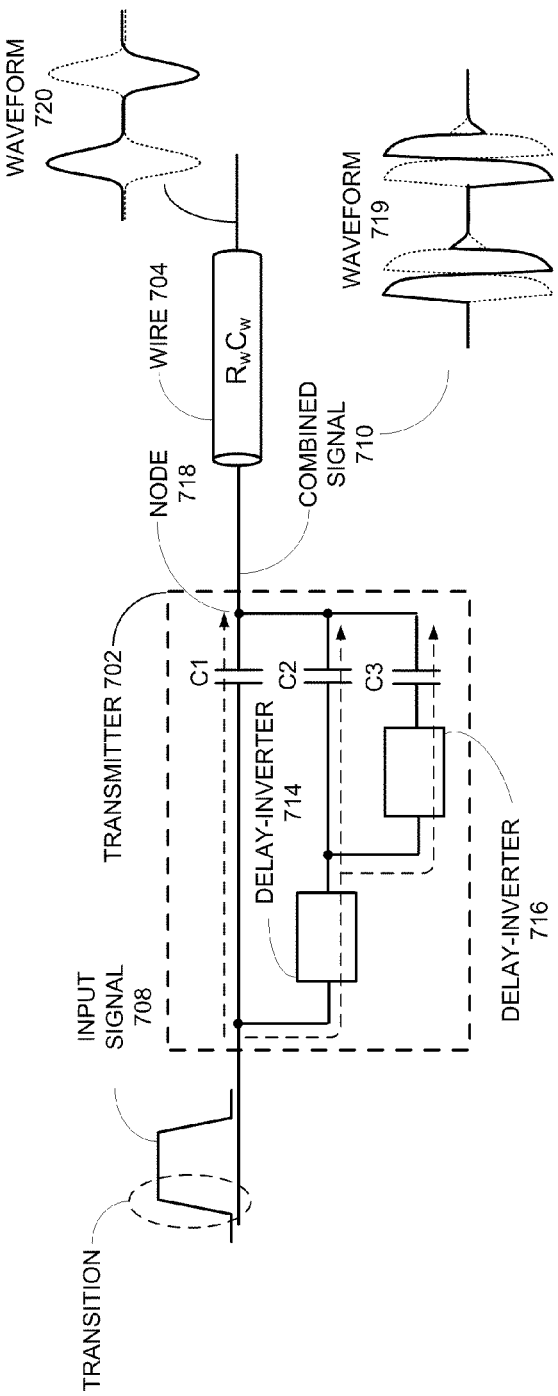
FIG. 7B illustrates an exemplary design for a transmitter in accordance with some embodiments of the present invention.

FIG. 7B illustrates an exemplary design for transmitter 702 in accordance with some embodiments of the present invention. As illustrated in FIG. 7B, transmitter 702 comprises three parallel signal paths. More specifically, the first signal path (i.e., the main signal path) includes a first series capacitor C1; the second signal path includes a delay-inverter 714 which is coupled in series with a second series capacitor C2; and the third signal path includes a delay-inverter 716 which is coupled in series with a third serial capacitor C3. A delay-inverter delays and inverts the input signal. In other words, the output of a delay-inverter is a delayed and inverted version of the input. The amount of delay that is introduced in the signal and the amplitude of the inverted signal can be configurable. In some embodiments, a delay-inverter includes a delay element and an inverter driver.

Input signal 708 directly passes through capacitor C1 in the first signal path, which generates a first pre-emphasized output signal. In the second signal path, input signal 708 is modified by delay-inverter 714 and then passes through capacitor C2, which generates a second pre-emphasized output signal. In the third signal path, input signal 708 is modified by both delay-inverter 714 and delay-inverter 716 and then passes through capacitor C3, which generates a third pre-emphasized output signal. The pre-emphasized output signals are then combined (e.g., by electrically connecting the outputs of capacitors C1, C2, and C3) to produce combined signal 710.

In some embodiments, input signal 708 encodes a data bit using a particular voltage value. For example, a "0" may be encoded using a low voltage value and a "1" may be encoded using a high voltage value. Hence, transitions in input signal 708 correspond to a zero-to-one change or a one-to-zero change in the data stream. A rising (falling) transition in input signal 708 passes through the first signal path and capacitor C1, which generates a positive (negative) transition at node 718. The transition in input signal 708 is also routed via the second signal path and delayed and inverted by delay-inverter 714 before passing through capacitor C2, which creates a delayed negative (positive) transition at node 718. In one embodiment, C2 is greater than C1, and therefore the negative (positive) transition created by C2 has a faster slew rate than the positive (negative) transition created by C1. As a result, the combined output of C1 and C2 has a waveform of a positive (negative) transition immediately followed by a negative (positive) transition. The transition in the input signal 708, after passing through delay-inverter element 714, is routed via the third signal path and delayed and inverted again by delay-inverter element 716, before passing through capacitor C3. The output of C3 is a further delayed positive (negative) transition. In one embodiment, C3 is smaller than both C1 and C2. Note that transmitter 702 does not include a pulse generator. Instead, transmitter 702 uses the delay-inverters and capacitors to generate a combined signal which when transmitted over the on-chip wire results in an RZ pulse of a desired shape.

Waveform 719 illustrates an exemplary combined signal 710 in response to a position (negative) transition followed by a negative (positive) transition. Note that the first half of waveform 719 comprises a positive spike immediately followed by a negative spike (i.e., a positive-negative bipolar signal), and immediately followed by a much smaller positive spike. This portion of waveform 719 corresponds to the positive data transition in the input signal. The second half of waveform 719 comprises a negative spike immediately followed by a positive spike (i.e., a negative-positive bipolar signal), and immediately followed by a much smaller negative spike. This portion of waveform 719 corresponds to the negative data transition in the input signal.

Note that one benefit of using an n-tap FIR filter design for transmitter 702 is to generate a predetermined sequence of pre-emphasized bipolar signals at node 718 based on the RLC characteristics of wire 704. Part of the filter design involves determining the size for each of the series capacitors. A properly designed sequence of pre-emphasized bipolar signals reduces or eliminates ISI on wire 704, and therefore produces desirable waveforms at the receiver end of wire 704. Waveform 720 illustrates an exemplary signal that is received at the receiver side of wire 704. Note that waveform 720 comprises clean and fast RZ pulses.

Although using three series capacitors in the transmitter creates overhead in area and capacitive load, the area overhead can be minimized by using NMOS transistors as the capacitors instead of creating capacitors from wires. For example, capacitors can be made by connecting the source-drain of the NMOS transistors as the first capacitor terminal, and the gate of the NMOS transistors as the second capacitor terminal.

While we describe an embodiment of transmitter 702 in the form of a 3-tap FIR filter having three capacitively coupled signal paths, other designs of transmitter 702 can include a fewer or greater number of signal paths. For example, one transmitter design can use only the first and the second signal paths (i.e., the C1 and C2 paths) in FIG. 7B. Generally, transmitter 702 can be implemented in the form of an n-tap FIR filter (n>1), wherein each tap is a separate signal path that can modify the input signal. Furthermore, each of the n signal paths passes the input signal or a modified input signal through a respective series capacitor which causes a respective pre-emphasis. The n outputs from the n series capacitors are then combined to form the combined signal which is then transmitted over the wire.

Figure 7C:
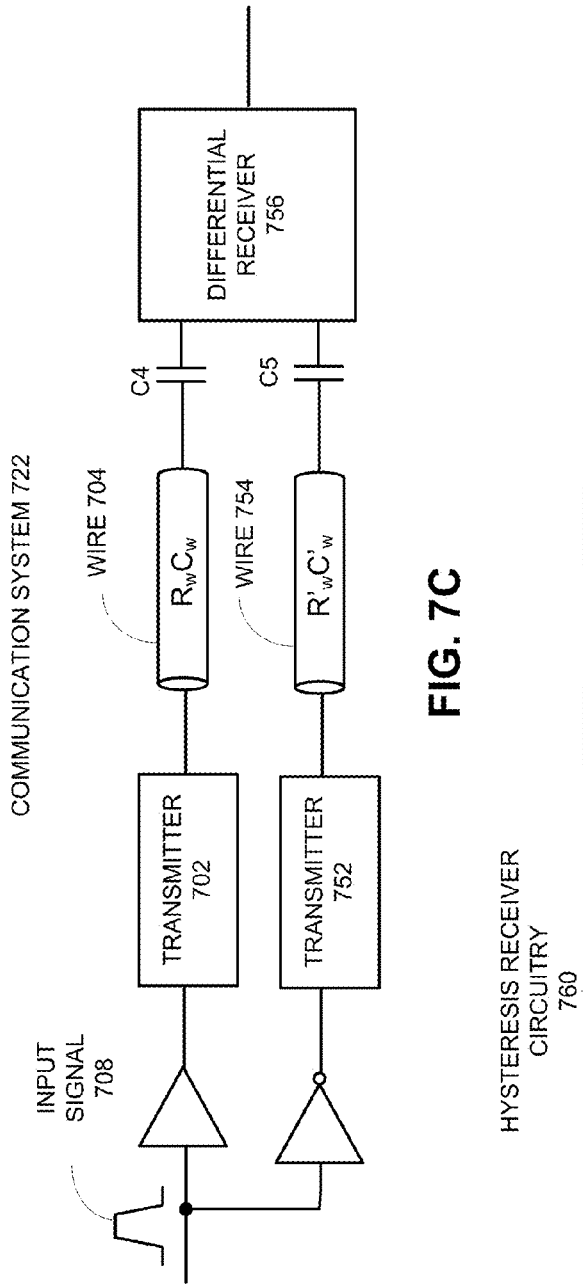
FIG. 7C illustrates a communication system that uses differential signaling in accordance with some embodiments of the present invention.

FIG. 7C illustrates a communication system that uses differential signaling in accordance with some embodiments of the present invention. For the sake of clarity, FIG. 7B illustrated only one part of a differential signaling communication system. Differential communication system 722 shown in FIG. 7C comprises two parallel channels for transmitting the two differential signals. Transmitters 702 and 752 can be used for transmitting the differential signals. Note that the delay-inverters and capacitances that are used in transmitters 702 and 752 are based on the characteristics of wires 704 and 754, respectively. Receiver 706 in FIG. 7A or receiver 756 in FIG. 7C can include differential hysteresis receiver circuitry. Note that the differential outputs from wires 704 and 754 can be capacitively coupled to receiver 706 through capacitors C4 and C5, respectively. In some embodiments, wires 704 and 754 can be directly coupled to receiver 706 in FIG. 7A or receiver 756 in FIG. 7C.

Receiver Design

Figure 7D:
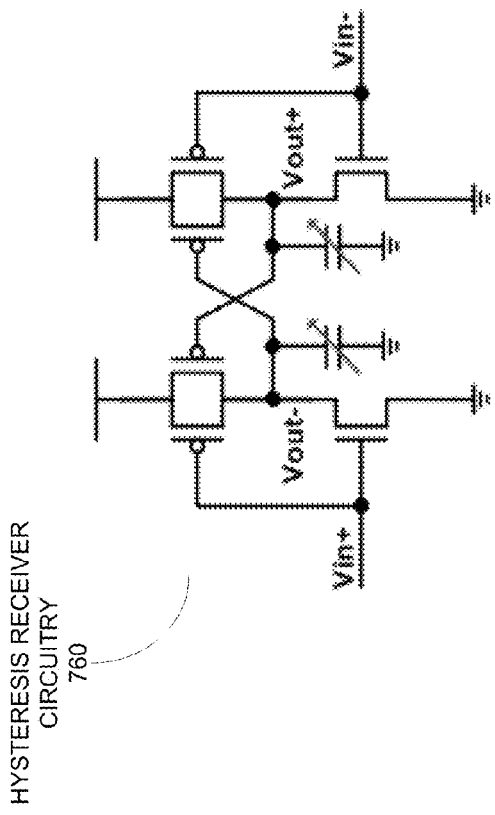
FIG. 7D illustrates an exemplary differential receiver for receiving differential signals in accordance with some embodiments of the present invention.

FIG. 7D illustrates an exemplary differential receiver 756 for receiving differential signals in accordance with some embodiments of the present invention. In some embodiments, differential receiver 756 includes hysteresis receiver circuitry 760 which is configured to recover data encoded in the input signal 708. Hysteresis receiver 756 evaluates a new output value only when the differential inputs split by more than a certain threshold (as shown in FIG. 3). If the differential inputs do not split more than the threshold, hysteresis receiver 756 maintains the previous data value.

Note that in FIG. 7D, the sizing of the differential NMOS pairs and the cross-coupled PMOS pairs (both pairs can be sized to 0.5 μm with minimum length) determines the speed of the hysteresis receiver. However, these transistors typically cannot be sized too large because they directly add capacitance to the output nodes, leading to excessive hysteresis. Without oversizing the transistors, the amount of hysteresis can be controlled by varying the capacitance of the output nodes (shown as Vout− and Vout+ in FIG. 7D). Consequently, improving the speed of hysteresis receiver 756 can be accomplished by increasing differential amplitude in the inputs, rather than sizing the transistors in the hysteresis receiver itself. Techniques for biasing the inputs of hysteresis receiver 756 are discussed below.

Biasing of Wire and Receiver

Figure 7E:
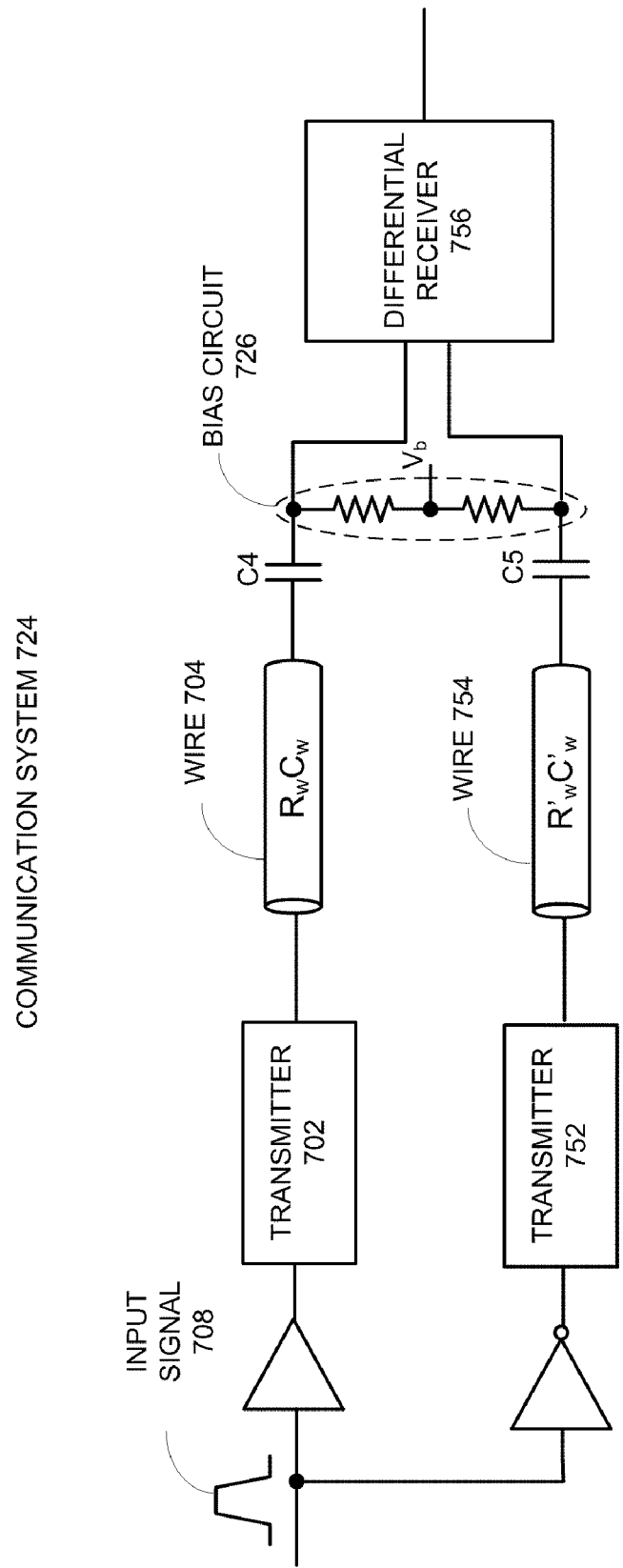
FIG. 7E illustrates an exemplary differential communication system having a receiver side bias circuit in accordance with some embodiments of the present invention.

FIG. 7E illustrates an exemplary differential communication system 724 having a receiver side bias circuit 726 in accordance with some embodiments of the present invention. In one embodiment, the inputs of hysteresis receiver 756 are biased to around Vdd/2 by using bias circuit 726 with a reference bias $V_b$ set to around Vdd/2. The reference bias is required at the hysteresis receiver inputs because hysteresis is built upon inherent fights between pull-down of NMOS input pairs and pull-up of cross-coupled PMOS pairs. The hysteresis behavior would not exist if the inputs were biased around Vdd or GND. Series capacitors C4 and C5 minimize the current requirements for creating the reference bias by isolating the receiver inputs from the high capacitive loads of on-chip wires 704 and 754, which allows the receiver to create the reference bias voltage by charging the small capacitive loads of C4 and C5.

On the other hand, it is beneficial to bias the on-chip wires (which are isolated from the receiver inputs via series capacitors C4 and C5) around Vdd. Note that using RZ signaling at the receiver end facilitates biasing of the differential wires at Vdd using leaky PMOS transistors, because both differential wires stay at the same voltage level when there is no data transition. In contrast, if we had used NRZ signaling, we would have had to intermittently pre-charge the wires, or we would have had to assume that the data is DC balanced, or we would have had to introduce a transconductance to address the DC biasing.

Therefore, capacitors C4 and C5 play two purposes. First, they reduce the bias current required from bias circuit 726 by preventing the wire capacitance $C_w$ from loading the receiver input. Second, they allow the wire bias and the receiver input bias to be different voltages by isolating their voltages. Some embodiments may not include capacitors C4 and C5. In these embodiments, wires 704 and 754 are directly coupled with the receiver input. This can cause bias device 726 to source more current, and the wire to be held at a suboptimal bias voltage. However, the circuit still operates in these embodiments.

Improving Bandwidth by Employing Double Data Rate (DDR)

Figure 8:
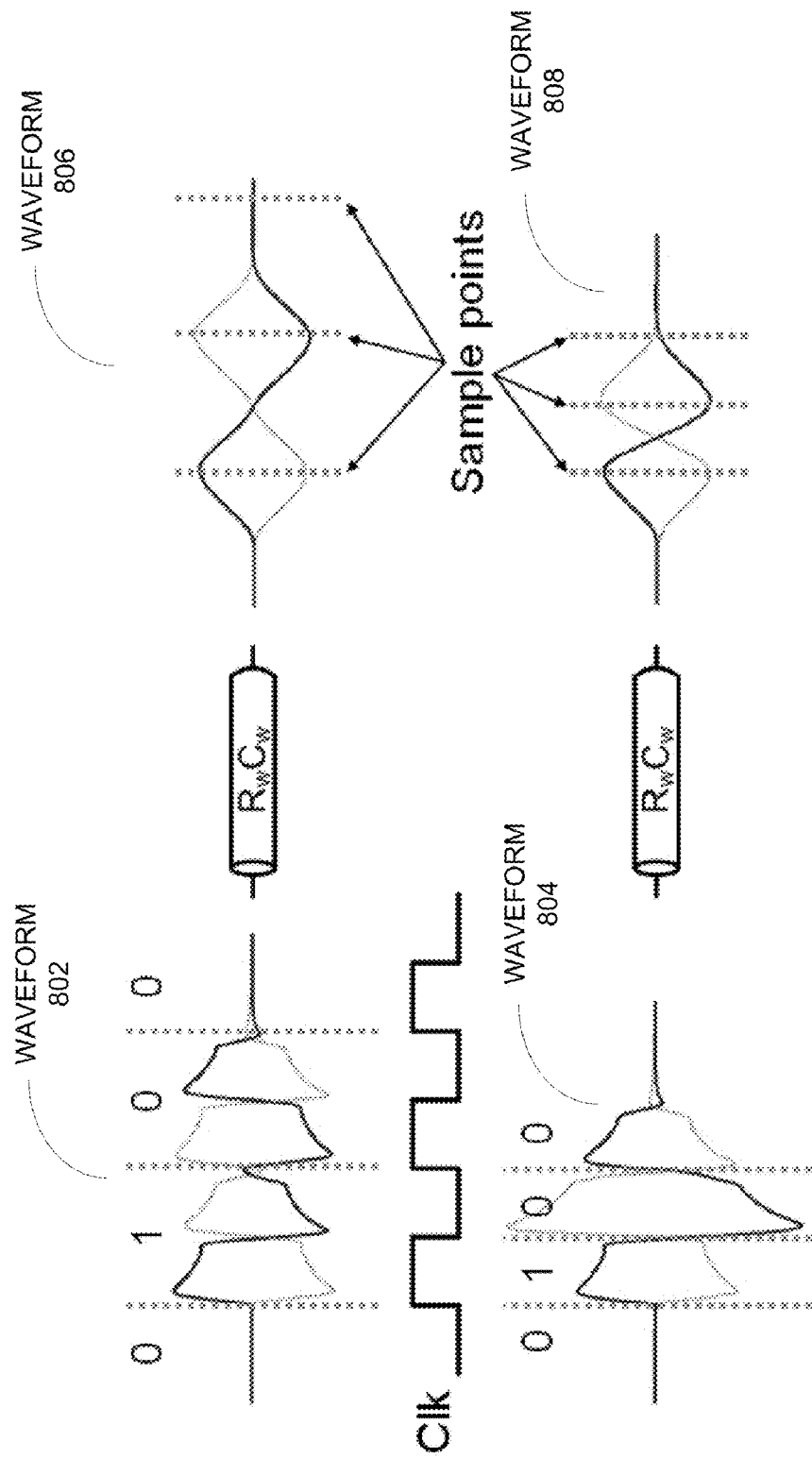
FIG. 8 illustrates a bandwidth improvement technique in accordance with some embodiments of the present invention.

FIG. 8 illustrates a bandwidth improvement technique in accordance with some embodiments of the present invention. Note that in NRZ signaling, the next transition of a rising transition is a falling transition. However, in the pre-emphasized bipolar signaling waveform 802, the next transition of the positive-negative bipolar signal is followed by a negative-positive bipolar signal at the transmitter end of the wire. Hence, when consecutive data transition occurs (for example 0→1→0), the negative (positive) portion of the current bipolar signal will be adjacent to the negative (positive) portion of the next bipolar signal. To further improve the bandwidth, one embodiment of the present invention overlaps those two adjacent negative (positive) portions to obtain twice the pre-emphasis as demonstrated in waveform 804.

In one embodiment, signal overlapping can be achieved by simply sending the next data bit at a faster data rate, such as using a DDR scheme. Note that this overlapping operation only occurs when one data transition is followed by another data transition. Otherwise, the overlapping operation does not occur. Waveforms 806 and 808 illustrate the resulting RZ signals at the receiver end of the wire before and after using the overlapping technique. In this manner the bandwidth of the data communication over the wire is adaptively controlled by overlapping bipolar signals at the transmitter end.

Figure 9:
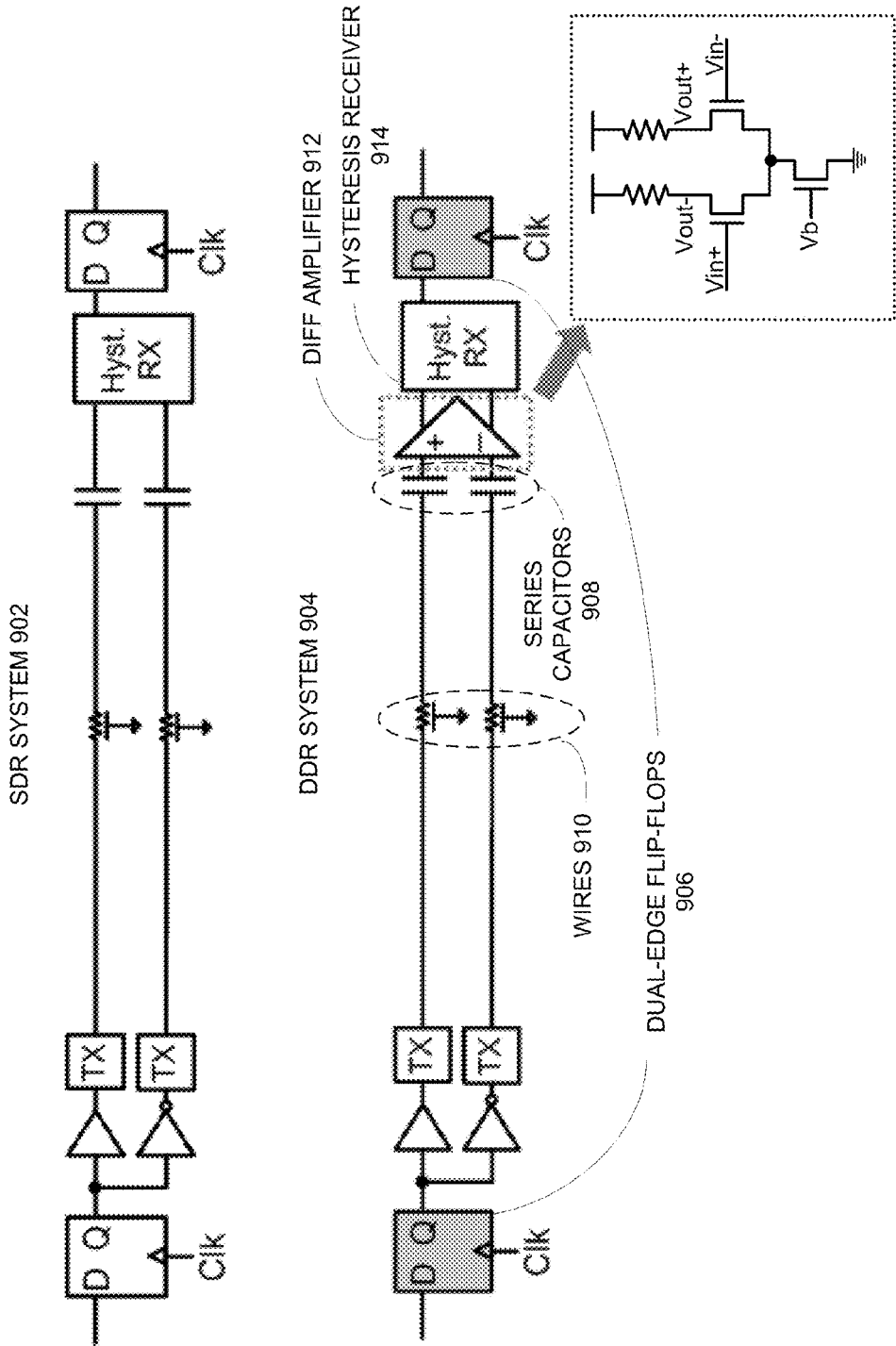
FIG. 9 compares a system that uses the overlapping technique with a system that does not use the overlapping technique in accordance with some embodiments of the present invention.

FIG. 9 compares a system that uses the overlapping technique with a system that does not use the overlapping technique in accordance with some embodiments of the present invention. Single data rate (SDR) system 902 which does not provide a signal overlapping function is similar to communication chancel 722 in FIG. 7C. In contrast, DDR system 904 employs the overlapping technique for further bandwidth improvement. DDR system 904 uses dual-edge flip-flops 906 which send and receive data at both positive and negative edges of the clock. In some embodiments, low $V_t$ transistors are used in these dual-edge flip-flops to achieve better latency.

Following series capacitors 908 at the receiver end of wires 910, a differential amplifier 912 is added to amplify the pulse swing at the inputs of hysteresis receiver 914. Note that, when attempting to achieve higher data rates (e.g., 5 Gb/s), the speed of the hysteresis receiver can be a concern because oversized cross-coupled PMOS devices may not be preferable. Amplifying the receiver input signals is an effective way to improve the latency of the receiver, and this is possible because series capacitors 908 isolate the receiver inputs from wires 910.

Figure 10:
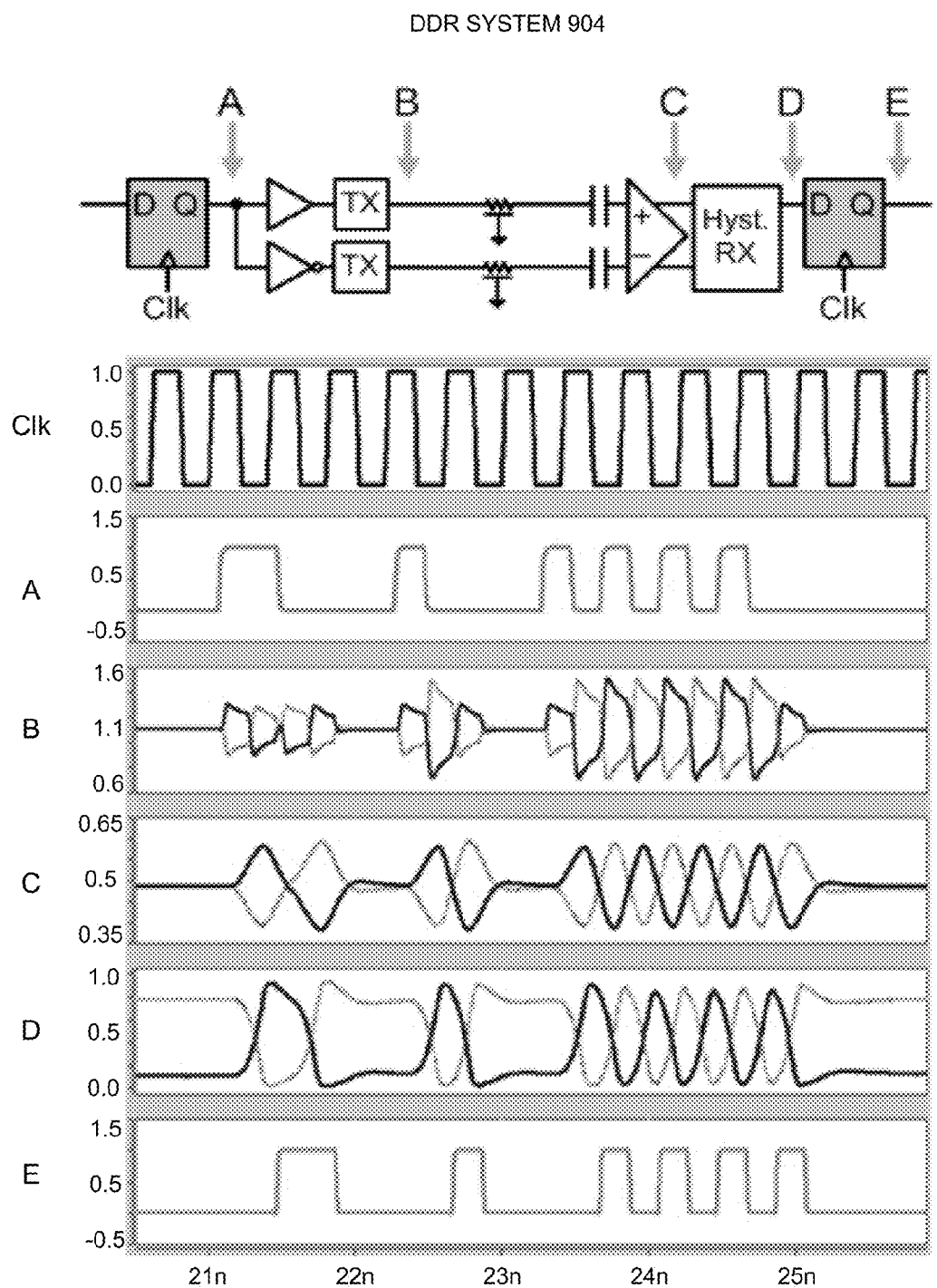
FIG. 10 illustrates simulated waveforms at intermediate nodes in a double-data-rate (DDR) system in accordance with some embodiments of the present invention.

FIG. 10 illustrates simulated waveforms at intermediate nodes in DDR system 904 in accordance with some embodiments of the present invention.

The simulation results in FIG. 10 are based on data transmission on both positive and negative edges of a 2.5 GHz clock. Waveform "Clk" represents the clock. Waveforms "A," "B," "C," "D," and "E" represent the voltage values at nodes "A," "B," "C," "D," and "E," respectively. Waveform "A" represents the input data signal, and waveform "E" represents the output data signal. Note that the pulse edges shown in waveform "B" are controlled adaptively for different data patterns, and 5 Gb/s signaling bandwidth is demonstrated while consuming total energy of 0.5 pJ/b. Waveform "C" illustrates the RZ pulses that are received at the receiver, and waveform "D" is the output of the hysteresis receiver. Bandwidth density of ≈9 Gb/s/μm is achieved at the expense of additional clocking energy and amplifier energy.

Conclusion

Some embodiments of the present invention provide a transceiver design for a repeater-less on-chip communication over a wire to achieve high bandwidth density, low latency, and low energy consumption. The exemplary transmitter design presented in this disclosure enables fast RZ signaling by reducing ISI on the wire. The RZ pulses can be received using a simple hysteresis receiver to recover the input data signal (which is encoded as an NRZ signal) from the RZ pulses. In an exemplary design using a 0.28 μm wide, 5 mm long wire in 90 nm CMOS technology, data rates of ≈3 Gb/s can be achieved with 0.3 pJ/b energy consumption, achieving 2× higher bandwidth density than conventional techniques with appreciably low energy consumption. By employing DDR, the pre-emphasis of the bipolar signals can be adaptively controlled, and the data communication bandwidth can be further improved to ≈5 Gb/s.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for transmitting signals on a wire within a chip, comprising:
   receiving an input voltage signal;
   generating one or more modified voltage signals from the input voltage signal;
   driving each of the input voltage signal and the one or more modified voltage signals through a respective capacitor to a first end of the wire;

combining a voltage signal on the output of each of the capacitors to obtain a combined voltage signal at the first end of the wire, wherein combining the voltage signals comprises combining the voltage signals so that the combined voltage signal at the first end of the wire has a predetermined first pulse shape so that a transmitted combined voltage signal at a second end of the wire comprises a return-to-zero (RZ) pulse with a predetermined second pulse shape; and transmitting the combined voltage signal from the first end of the wire to the second end of the wire, wherein transmitting the combined voltage signal comprises, when a consecutive data transition occurs for the combined voltage signal, combining two negative or two positive adjacent portions for the consecutive data transition to obtain twice a pre-emphasis for the combined adjacent portions than a pre-emphasis for the consecutive data transition when the adjacent portions are not combined.

2. The method of claim 1, wherein after the combined voltage signal is transmitted over the wire, the method further comprises receiving the transmitted voltage signal at a second end of the wire.

3. The method of claim 2, wherein receiving the transmitted voltage signal at the second end of the wire involves using a capacitor coupled in series with the wire to receive the transmitted voltage signal.

4. The method of claim 2, wherein receiving the transmitted voltage signal at the second end of the wire involves using a hysteresis receiver circuit.

5. The method of claim 1, wherein the method further comprises:
sizing each of the capacitors so that the combined voltage signal at the first end of the wire has the predetermined first pulse shape.

6. The method of claim 1, wherein generating the one or more modified voltage signals from the input voltage signal comprises generating a delayed and inverted version of the input voltage signal.

7. The method of claim 1, wherein generating the one or more modified voltage signals from the input voltage signal comprises generating a delayed version of the input voltage signal.

8. A circuit that transmits signals on a wire within a chip, comprising:
a first voltage signal path which is capacitively coupled to a first end of the wire through a first capacitor, wherein the first signal path is configured to pass an input voltage signal through the first capacitor to the first end of the wire; and
one or more additional voltage signal paths, wherein each of the one or more additional voltage signal paths is capacitively coupled to the first end of the wire through a respective capacitor, wherein each of the one or more additional voltage signal paths is configured to modify the input voltage signal and pass the respective modified input voltage signal through the respective capacitor to the first end of the wire;
wherein an output voltage signal of each of the first capacitor and the respective capacitors is combined at the first end of the wire to form a combined voltage signal that has a predetermined first pulse shape so that a transmitted combined voltage signal at a second end of the wire comprises a return-to-zero (RZ) pulse with a predetermined second pulse shape,
wherein combining the output voltage signals comprises, when a consecutive data transition occurs for the combined voltage signal, combining two negative or two positive adjacent portions for the consecutive data transition to obtain twice a pre-emphasis for the combined adjacent portions than a pre-emphasis for the consecutive data transition when the adjacent portions are not combined.

9. The circuit of claim 8, further comprising a receiver circuitry which is coupled to a second end of the wire.

10. The circuit of claim 9, wherein the receiver circuitry is coupled to the second end of the wire through a coupling capacitor.

11. The circuit of claim 9, wherein the receiver circuitry includes a hysteresis receiver.

12. A chip, comprising
a first chip module;
a second chip module;
a wire disposed between the first chip module and the second chip module;
a first voltage signal path in the first chip module which is capacitively coupled to a transmitting node of the wire through a first capacitor, wherein the first voltage signal path is configured to pass an input voltage signal through the first capacitor to the first end of the wire; and
one or more additional voltage signal paths in the first chip module, wherein each of the one or more additional voltage signal paths is capacitively coupled to the transmitting node of the wire through a respective capacitor, wherein each of the one or more additional voltage signal paths is configured to modify the input voltage signal and pass the respective modified input voltage signal through the respective capacitor to the first end of the wire;
wherein an output voltage signal of each of the first capacitor and the respective capacitors is combined at the first end of the wire to form a combined voltage signal that has a predetermined first pulse shape so that a transmitted combined voltage signal at a second end of the wire comprises a return-to-zero (RZ) pulse with a predetermined second pulse shape,
wherein combining the output voltage signals comprises, when a consecutive data transition occurs for the combined voltage signal, combining two negative or two positive adjacent portions for the consecutive data transition to obtain twice a pre-emphasis for the combined adjacent portions than a pre-emphasis for the consecutive data transition when the adjacent portions are not combined.

13. The chip of claim 12, further comprising a receiver circuitry in the second chip module which is coupled to a receiving node of the wire in the second chip module.

14. The chip of claim 13, wherein the receiver circuitry is coupled to the receiving node of the wire through a coupling capacitor.

* * * * *